United States Patent
Joo et al.

(10) Patent No.: US 9,724,715 B2
(45) Date of Patent: Aug. 8, 2017

(54) DEPOSITING APPARATUS AND METHOD FOR MEASURING DEPOSITION QUANTITY USING THE SAME

(71) Applicant: Samsung Display Co., Ltd., Yongin, Gyeonggi-Do (KR)

(72) Inventors: Sung-Joong Joo, Yongin (KR); You-Min Cha, Yongin (KR); Seuk-Hwan Park, Yongin (KR)

(73) Assignee: Samsung Display Co., Ltd, Yongin-si (KR)

( * ) Notice: Subject to any disclaimer, the term of this patent is extended or adjusted under 35 U.S.C. 154(b) by 726 days.

(21) Appl. No.: 13/953,982

(22) Filed: Jul. 30, 2013

(65) Prior Publication Data

US 2014/0037849 A1    Feb. 6, 2014

(30) Foreign Application Priority Data

Jul. 31, 2012   (KR) .................. 10-2012-0084201

(51) Int. Cl.
  *C23C 14/04*   (2006.01)
  *B05B 12/00*   (2006.01)
  *C23C 14/54*   (2006.01)

(52) U.S. Cl.
  CPC ............ *B05B 12/00* (2013.01); *C23C 14/545* (2013.01); *C23C 14/04* (2013.01)

(58) Field of Classification Search
  CPC ................................. C23C 14/04; C23C 14/24
  USPC ......... 118/300, 313, 314, 720–721, 726–727
  See application file for complete search history.

(56) References Cited

U.S. PATENT DOCUMENTS

| | | | |
|---|---|---|---|
| 6,051,070 A * | 4/2000 | Sunter | A21C 9/04 |
| | | | 118/13 |
| 8,709,540 B2 | 4/2014 | Yamazaki | |
| 9,450,140 B2 | 9/2016 | Jo et al. | |
| 2001/0001945 A1* | 5/2001 | Hiraga | B05D 1/02 |
| | | | 118/50 |
| 2005/0016462 A1* | 1/2005 | Yamazaki | C23C 14/12 |
| | | | 118/726 |
| 2011/0052791 A1* | 3/2011 | Jo | C23C 14/042 |
| | | | 427/8 |

(Continued)

FOREIGN PATENT DOCUMENTS

| | | |
|---|---|---|
| JP | 2005-150061 | 6/2005 |
| JP | 2007-005249 | 1/2007 |

(Continued)

*Primary Examiner* — Cachet Sellman
(74) *Attorney, Agent, or Firm* — H.C. Park & Associates, PLC (57) ABSTRACT

A deposition apparatus may uniformly control deposited quantities of a plurality of depositing sources by efficiently determining an abnormal depositing source. The deposition apparatus may reduce loss of materials by exactly determining an abnormal depositing source. The deposition apparatus includes: a plurality of depositing sources spraying a deposition material; a substrate holder fixing a substrate to face the depositing source; a depositing source shutter disposed at one side of the depositing source and opening and closing an passage of each depositing source; and a main shutter disposed between the depositing source and the substrate fixed to the substrate holder and depositing a part of the deposition material on the substrate through the main shutter.

17 Claims, 9 Drawing Sheets (56) References Cited

U.S. PATENT DOCUMENTS

| | | | |
|---|---|---|---|
| 2013/0196454 A1 | 8/2013 | Inoue et al. | |
| 2013/0273679 A1 | 10/2013 | Sonoda et al. | |
| 2013/0291796 A1* | 11/2013 | Inoue | C23C 14/243 |
| | | | 118/720 |

FOREIGN PATENT DOCUMENTS

| | | | |
|---|---|---|---|
| JP | 2008-075095 | 4/2008 | |
| JP | 2008-231446 | 10/2008 | |
| JP | 2009-256705 | 11/2009 | |
| JP | 2011-049167 | 3/2011 | |
| JP | WO 2012099012 A1 * | 7/2012 | ........... C23C 14/243 |
| KR | 1020070051602 A | 5/2007 | |
| KR | 1020070051639 A | 5/2007 | |
| WO | 2004-054325 | 6/2004 | |
| WO | 2010-082755 | 4/2010 | |
| WO | 2012-056877 | 5/2012 | |
| WO | 2012-090777 | 7/2012 | |

* cited by examiner

DEPOSITING APPARATUS AND METHOD FOR MEASURING DEPOSITION QUANTITY USING THE SAME

CLAIM OF PRIORITY

This application makes reference to, incorporates the same herein, and claims all benefits accruing under 35 U.S.C. §119 from an application earlier filed in the Korean Intellectual Property Office on Jul. 31, 2012 and there duly assigned Serial No. 10-2012-0084201.

BACKGROUND OF THE INVENTION

Field of the Invention

Embodiments of the present invention relate generally to a depositing apparatus and a method for measuring a deposited quantity using the same, and more particularly, to a depositing apparatus capable of exactly measuring a deposited quantity by using a double shutter and a method for measuring a deposited quantity using the same.

Description of the Related Art

An organic light emitting diode display includes a hole injection electrode, an electron injection electrode, and an organic emission layer formed therebetween. The organic light emitting diode display is a self-emission display device in which a hole injected from an anode and an electron injected from a cathode are recombined with each other in the organic emission layer and dissipated to emit light. Further, since the organic light emitting diode display has high-grade characteristics such as low power consumption, high luminance, a wide viewing angle, and a high response speed, the organic light emitting diode display receives attention as the next-generation display device for portable electronic devices.

The organic light emitting diode display includes an organic emission panel including a thin film transistor and a display substrate with an organic light emitting diode (OLED). The organic light emitting diode (OLED) includes an anode, a cathode, and an organic emission layer. The organic emission layer emits light when an exciton formed by the hole and the electron injected from the anode and the cathode, respectively, is transited into a ground state.

To manufacture a flat panel display device such as an organic light emitting diode display, a vacuum deposition method is widely used, in which an organic material or metal used as an electrode is deposited in a vacuum environment to form a thin layer on a flat panel. The vacuum deposition method is performed by positioning a substrate on which forms an organic thin layer in a vacuum chamber, evaporating or sublimating the organic material by using a depositing source spraying a deposition material, and depositing the organic material on the substrate.

In this case, it is required to determine whether a deposited material such as an organic material or an inorganic material is uniformly sprayed from the depositing source. Particularly, in the case of a plurality of depositing sources, a process of controlling a deposited quantity of each depositing source by determining the deposited quantity of each of the plurality of depositing sources is highly demanded.

The above information disclosed in this Background section is only for enhancement of understanding of the background of the described technology and therefore it may contain information that does not form the prior art that is already known in this country to a person of ordinary skill in the art.

SUMMARY OF THE INVENTION

An embodiment of the present invention provides a depositing apparatus having advantages of uniformly controlling deposited quantities of a plurality of depositing sources.

Further, an embodiment of the present invention provides a method for measuring a deposited quantity having advantages of exactly determining an abnormal depositing source by using one test substrate.

An embodiment of the present invention provides a depositing apparatus, including: a plurality of depositing sources spraying a deposition material; a substrate holder fixing a substrate to face the depositing source; a depositing source shutter disposed at one side of the depositing source and opening and closing a passage of each depositing source; and a main shutter disposed between the depositing source and the substrate fixed to the substrate holder and configured to deposit a part of the deposition material on the substrate through the main shutter.

Another embodiment of the present invention provides a method for measuring a deposited quantity, including: a test substrate disposing step of facing a plurality of depositing sources spraying a deposition material to the test substrate of which the surface is divided into a plurality of areas; a deposition area setting step of setting one area of the surface of the test substrate as a deposition area to which the deposition material is attached; a first opening step of selecting and opening some depositing sources to measure a deposition quantity among the plurality of depositing sources; a first depositing step of depositing partially the deposition material on one area of the surface of the test substrate based on a position corresponding to the depositing source; and a first closing step of closing the some depositing sources.

According to the embodiments of the present invention, it is possible to uniformly control deposited quantities of a plurality of depositing sources by efficiently determining an abnormal depositing source.

Further, it is possible to reduce loss of materials by exactly determining an abnormal depositing source.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, a depositing apparatus and a method for measuring a deposition quantity according to embodiments of the present invention will be described in detail with reference to the accompanying drawings. As those skilled in the art would realize, the described embodiments may be modified in various different ways, all without departing from the spirit or scope of the present invention. On the contrary, embodiments introduced herein are provided to make disclosed contents thorough and complete and sufficient transfer the spirit of the present invention to those skilled in the art. Like reference numerals designate like elements throughout the drawings.

Further, throughout this specification, unless explicitly described to the contrary, the word "comprise" and variations such as "comprises" or "comprising", will be understood to imply the inclusion of stated elements but not the exclusion of any other elements. In addition, throughout this specification, the word "on" will be understood to be positioned above or below a target portion, and will be not necessarily understood to be positioned at an upper side based on a gravity direction.

Figure 1:
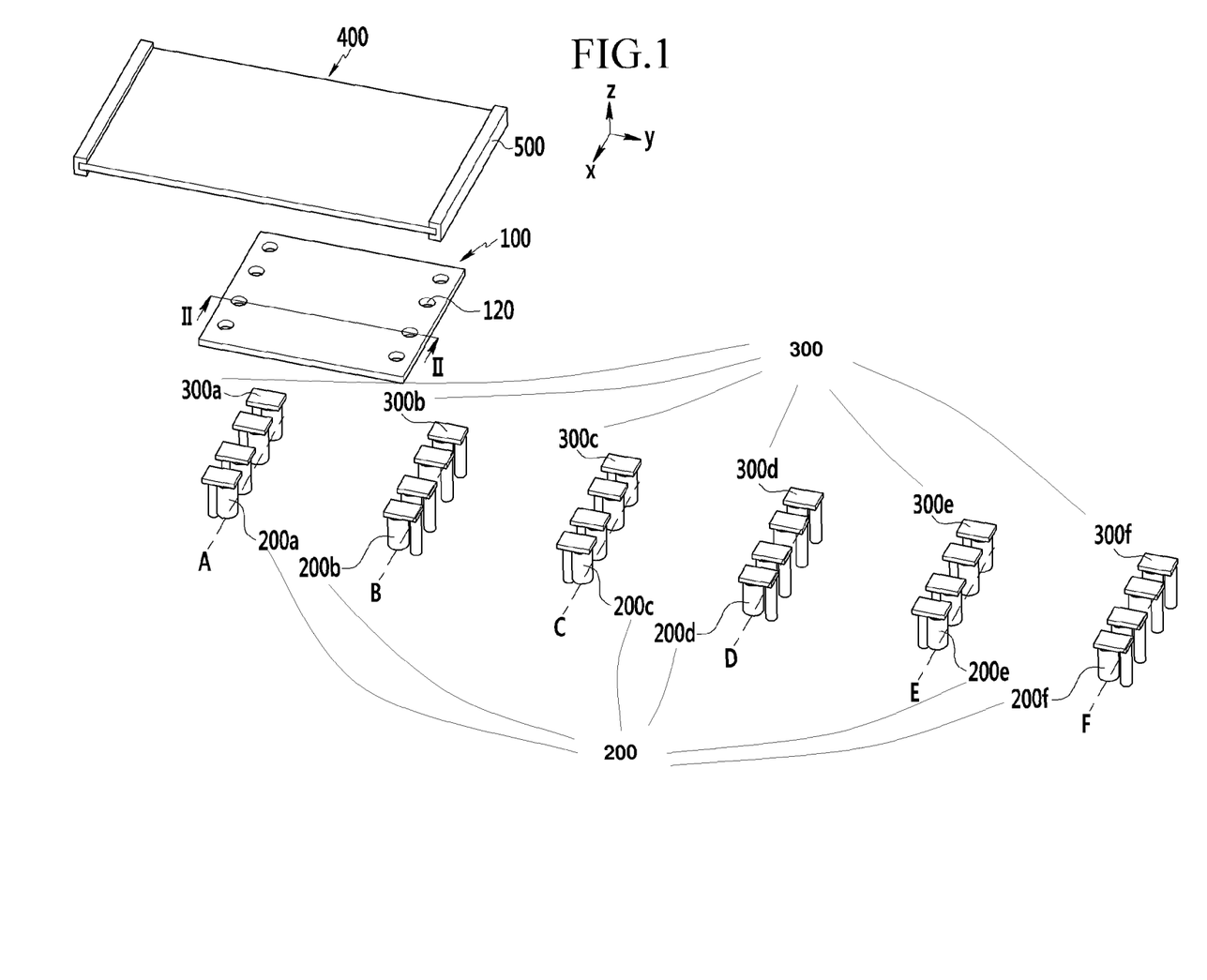
FIG. 1 is an oblique view of a depositing apparatus according to an embodiment of the present invention.
Figure 2:
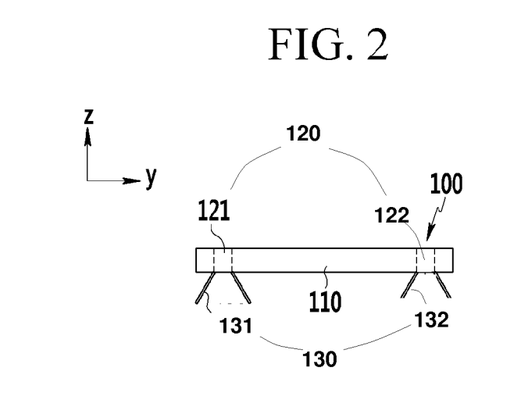
FIG. 2 is a cross-sectional view of a main shutter taken along line II-II of FIG. 1.
Figure 3:
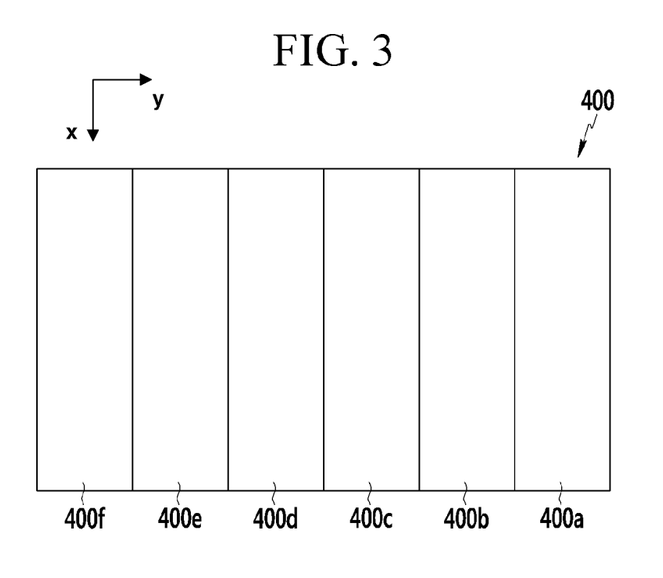
FIG. 3 is a plan view of a test substrate according to an embodiment of the present invention.

FIG. 1 is an oblique view of a depositing apparatus according to an embodiment of the present invention, FIG. 2 is a cross-sectional view of a main shutter taken along line II-II of FIG. 1, and FIG. 3 is a plan view of a test substrate according to an embodiment of the present invention.

Referring to FIGS. 1 to 3, a depositing apparatus constructed according to an embodiment of the present invention includes a depositing source 200, a substrate holder 500, a depositing source shutter 300, and a main shutter 100.

For convenience of the description, although a chamber is not shown in each drawing, all constituent elements of FIG. 1 are disposed in a vacuum chamber in which a degree of vacuum is properly maintained. The vacuum chamber may have various shapes in accordance with a shape of a substrate to be processed. For example, in the case where the substrate to be processed has a circular shape, the vacuum chamber entirely has a cylindrical shape, and in the case where the processed substrate has a rectangular shape, the vacuum chamber entirely has a cuboid shape. In addition, in the vacuum chamber, a vacuum pump (not shown) which discharges the gas in the vacuum chamber to lower the pressure in the vacuum chamber, a venting means (not shown) which injects a gas into the vacuum chamber to increase the pressure in the vacuum chamber, and the like may be further included.

The depositing source 200 is a means of discharging a deposition material to deposit the deposition material on a substrate 400, and includes a space (not shown) storing the deposition material such as an organic material therein. The storing space of the depositing source may be made of a ceramic material such as alumina ($Al_2O_3$) and aluminum nitride (AlN) having excellent thermal radiation, but is not limited thereto and may be made of various materials having excellent thermal radiation and thermal resistance. A heater (not shown) configured to contact and surround an outer surface of the storing space may be provided at the outer surface of the storing space of the depositing source and serves to heating and vaporizing the stored deposition material. A spraying nozzle (not shown) spraying the vaporized or sublimated deposition material at the internal space of the depositing source may be further included at one side of the depositing source 200 which faces the substrate 400. The depositing source 200 may be configured of a plurality of linear depositing sources in which a plurality of nozzles is included in a row of or a plurality of dot depositing sources in which one nozzle is included, and in the embodiment, the plurality of dot depositing sources is exemplified, but is not limited thereto.

The substrate 400 fixed by the substrate holder 500 faces the depositing source 200. Since the substrate holder 500 stably fixes the substrate 400 while forming a thin layer on the substrate 400 and carries out the substrate 400 after a deposition process has completed, the substrate holder 500 has a structure capable of easily attaching and detaching the substrate 400. Since the configuration of the substrate holder 500 is the same as the configuration used in a general depositing apparatus, the detailed description thereof is omitted.

While the depositing source 200 and the substrate 400 move relatively to each other, a deposition may be performed. In the case where the depositing source 200 is fixed, the substrate holder 500 may move so that the substrate 400 moves with a predetermined distance from the depositing source 200 (y-axial direction of FIG. 1). In the case where the depositing source 200 is disposed so as to discharge the deposition material in a vertical direction, the substrate 400 may be horizontally disposed above the depositing source 200. In the case where the depositing source 200 is disposed so as to discharge the deposition material in a horizontal direction, the substrate 400 may be vertically disposed. In the exemplary embodiment, the depositing source 200 is disposed on the bottom of the vacuum chamber and the substrate 400 is horizontally disposed at the upper side thereof, but it is not limited thereto.

The depositing apparatus constructed according to the embodiment may deposit an organic material or an inorganic material for forming an organic emission layer or an electrode layer on a substrate for deposition by using a mask for deposition. In addition, before the deposition material such as the organic material or the inorganic material is deposited, a test deposition is performed by using a test substrate in order to verify whether the deposition material sprayed from the depositing source 200 is uniformly deposited on the test substrate and to measure a deposited quantity on a respective area of the test substrate. In the embodiment, the case where the test deposition is performed by the test substrate will be described. The surface of the test substrate 400 may be divided into a plurality of areas, for example 400a through 400f as shown in FIG. 3. A detailed description thereof will be described below.

The depositing source shutter 300 is a means for controlling an amount of the vaporized deposition material to be deposited on the substrate 400. The depositing source shutter 300 is disposed at one side of every depositing source 200 to open and close a passage of the respective depositing source 200. More specifically, when the depositing source shutter 300 opens the passage of the respective depositing source 200, a vapor-stated deposition material generated by vaporizing the deposition material included in the depositing source 200 is deposited on the substrate 400. On the other hand, when the depositing source shutter 300 closes the passage of the respective depositing source 200, the depositing source shutter 300 prevents the vaporized disposition material from depositing on the substrate 400. In order to shorten a processing time, the deposition process is performed in a state where the deposition material can be sufficiently vaporized by sufficiently heating the depositing source 200 before the deposition material is deposited on the substrate 400. The depositing source shutter 300 blocks the passage of the depositing source 200 in a preheating process before the deposition process or a process after the deposition process during which a thin layer having a desired thickness has been deposited on the substrate 400; therefore, no additional deposition material is deposited on the substrate 400 before or after the deposition process. Since the detailed configuration of the depositing source shutter 300 is the same as the configuration of a known depositing apparatus, the detailed description thereof is omitted.

The main shutter 100 is a means to deposit a part of the deposition material sprayed from the depositing source 200, which passes through the main shutter 100, on a predetermined area of the substrate 400. The main shutter 100 is disposed between the depositing source 200 and the substrate 400 fixed to the substrate holder 500. The main shutter 100 is not used in a depositing process for forming the organic emission layer or the electrode layer, but used in the case of measuring the deposited quantity through the test deposition. The main shutter 100 may move in a y-axial direction so as to be selectively disposed on the depositing source 200 to deposit the respective deposition material in a predetermined area of the substrate 400. The deposited quantity among the plurality of depositing sources 200 can be measured to determine whether the deposited quantity of the respective depositing source is insufficient or excessive.

As shown in FIG. 2, the main shutter 100 may include a main shutter body 110 formed in a plate shape and an opening 120 (121 and 122) formed by passing through the main shutter body 110 in a thickness direction (z-axis direction). The part of the deposition material sprayed from the depositing source 200 passes through the opening 120 to reach the substrate 400, and the remaining part is blocked by the main shutter body 110 to deposit the deposition material on the predetermined area. In the exemplary embodiment, a cross section of the opening 120 is shown as a circle, but is not limited thereto and may be formed in various shapes such as a polygon.

The opening 120 may be formed in accordance with respective positions of the passages of the plurality of depositing source 200. In this case, a guiding unit 130 (131 and 132) surrounding each opening 120 may be further included on one surface of the main shutter body 110 facing the depositing source 200. This is to pass the deposition material discharged from the depositing source 200 corresponding to each opening 120 and block the deposition material discharged from the depositing source 200 corresponding to another opening 120.

The plurality of depositing sources 200 may be disposed in an m×n matrix form having m rows in a first direction (x-axial direction) and n columns in a second direction (y-axial direction) crossing the first direction. In this case, each opening 120 formed in accordance with each depositing source 200 may be formed in a matrix form having m rows and k (k<n) columns. That is, the opening 120 is formed in accordance with all of the depositing sources 200 in the first direction and formed smaller than the number of the depositing sources 200 in the second direction. Then, the main shutter 100 is formed to move in the second direction and may be disposed in accordance with a depositing source of another row and column disposed in the second direction. The substrate holder 500 is further formed to move in the second direction, and one area of the surface of the test substrate 400 may be set as a deposition area corresponding to the column of the depositing source 200. In this specification, the deposition area means one area of the test substrate to which the deposition material is attached.

Hereinafter, a method for measuring a deposition quantity according to another exemplary embodiment will be described with reference to the drawings.

Figure 4:
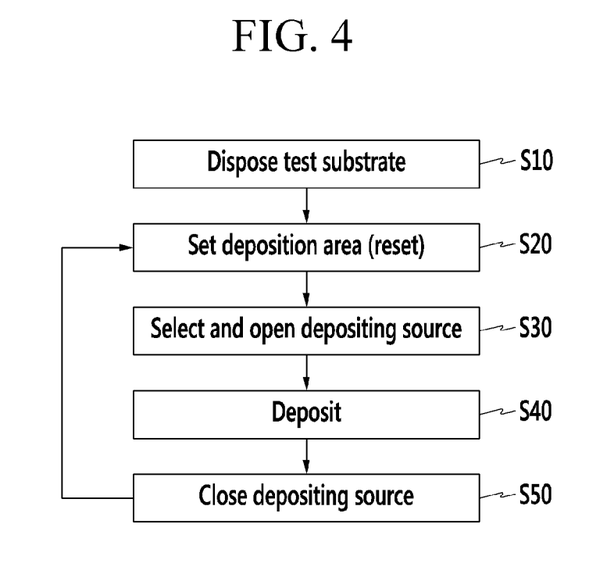
FIG. 4 is a flowchart illustrating a method for measuring a deposition quantity according to another embodiment of the present invention.
Figure 5A:
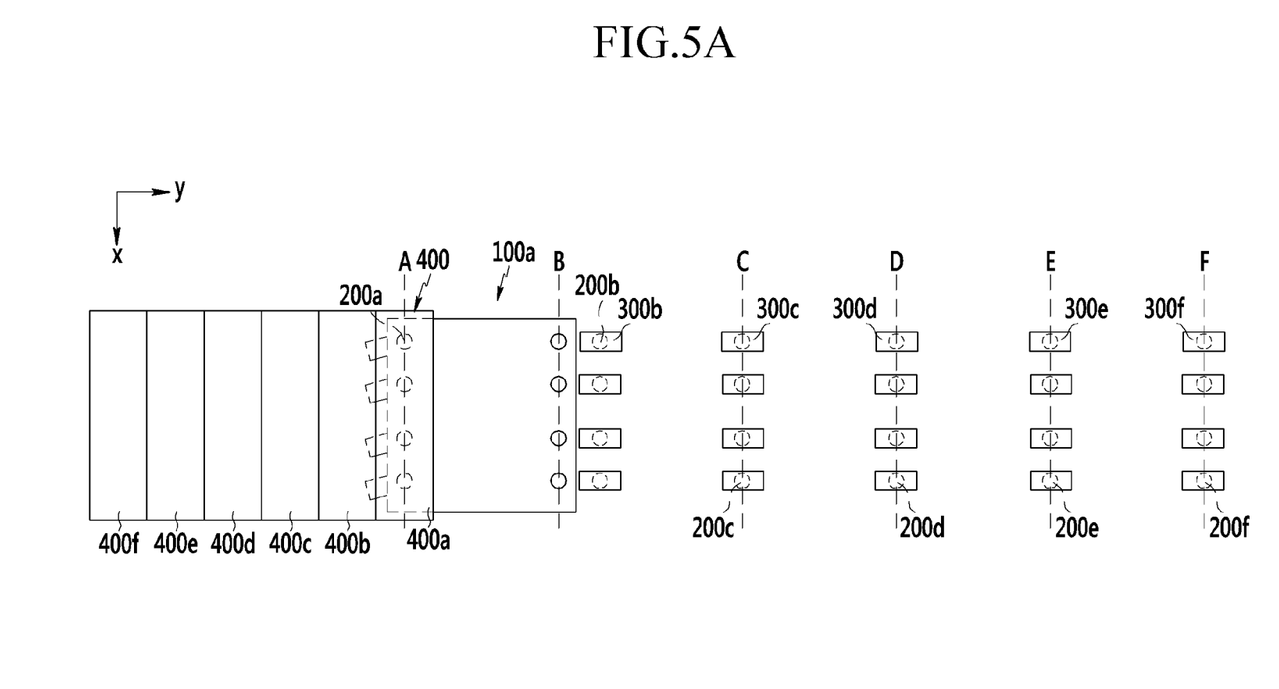
FIGS. 5A, 6A, and 7A are plan views sequentially illustrating the method for measuring a deposited quantity according to another embodiment of the present invention.
Figure 5B:
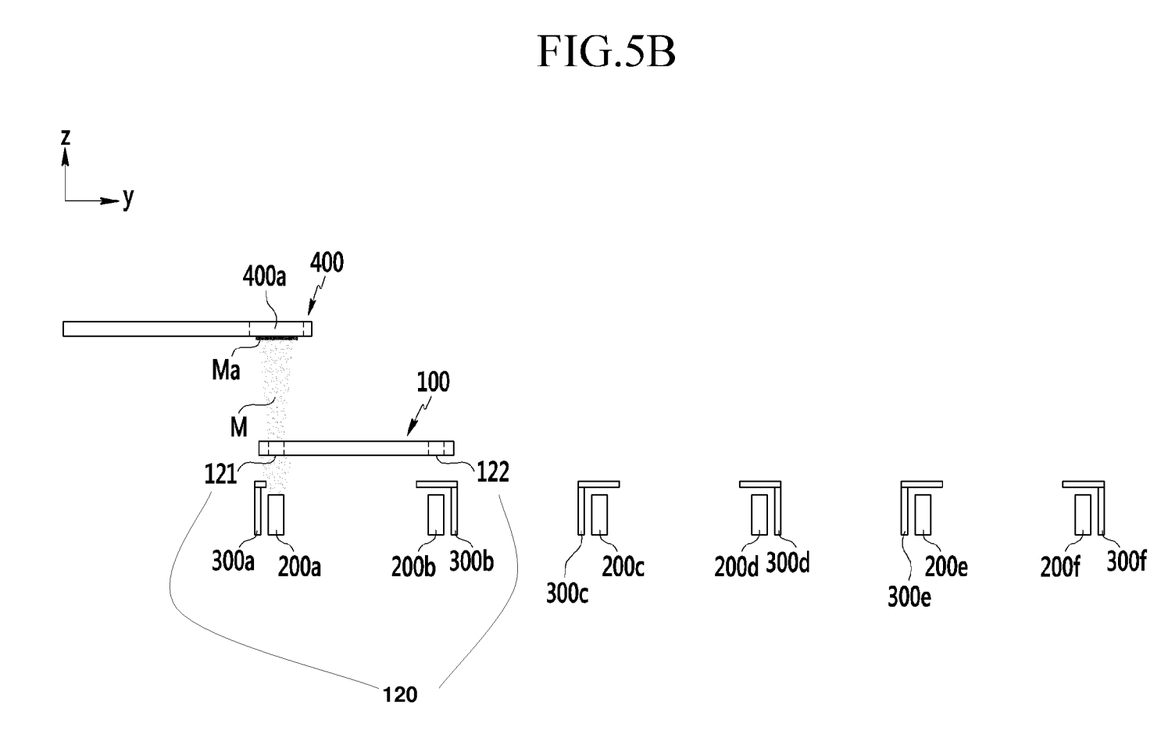
FIGS. 5B, 6B, and 7B are side views sequentially illustrating the method for measuring a deposited quantity according to another exemplary embodiment of the present invention.
Figure 6A:
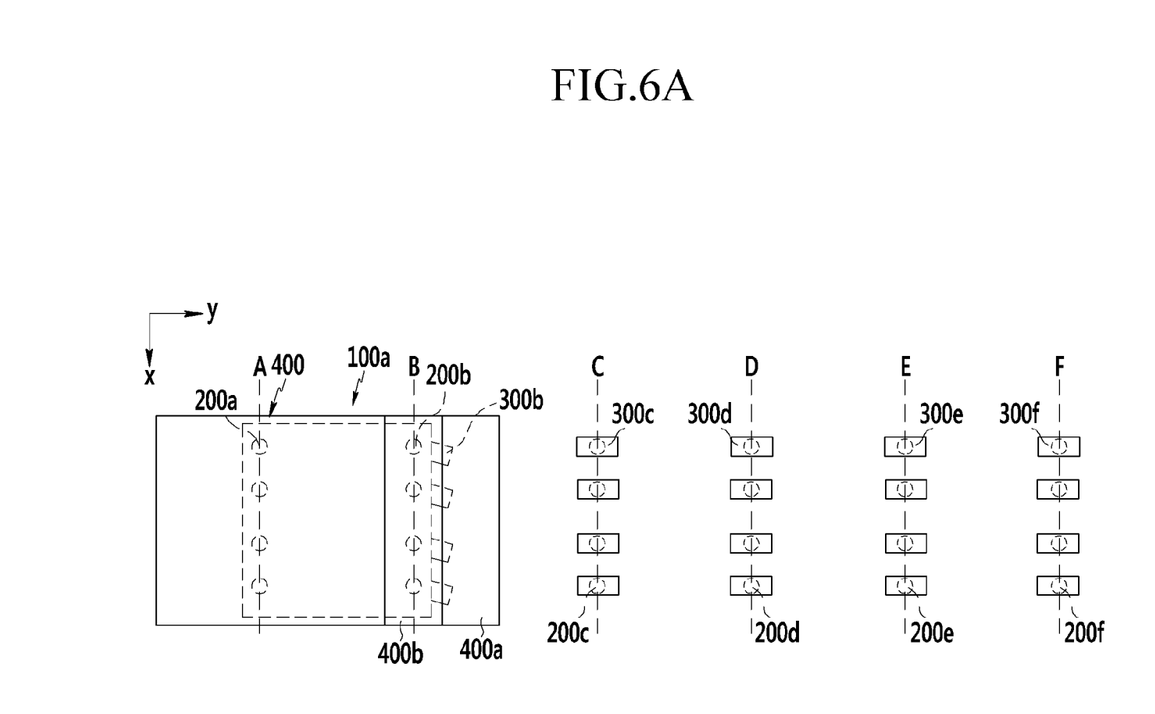
Figure 6B:
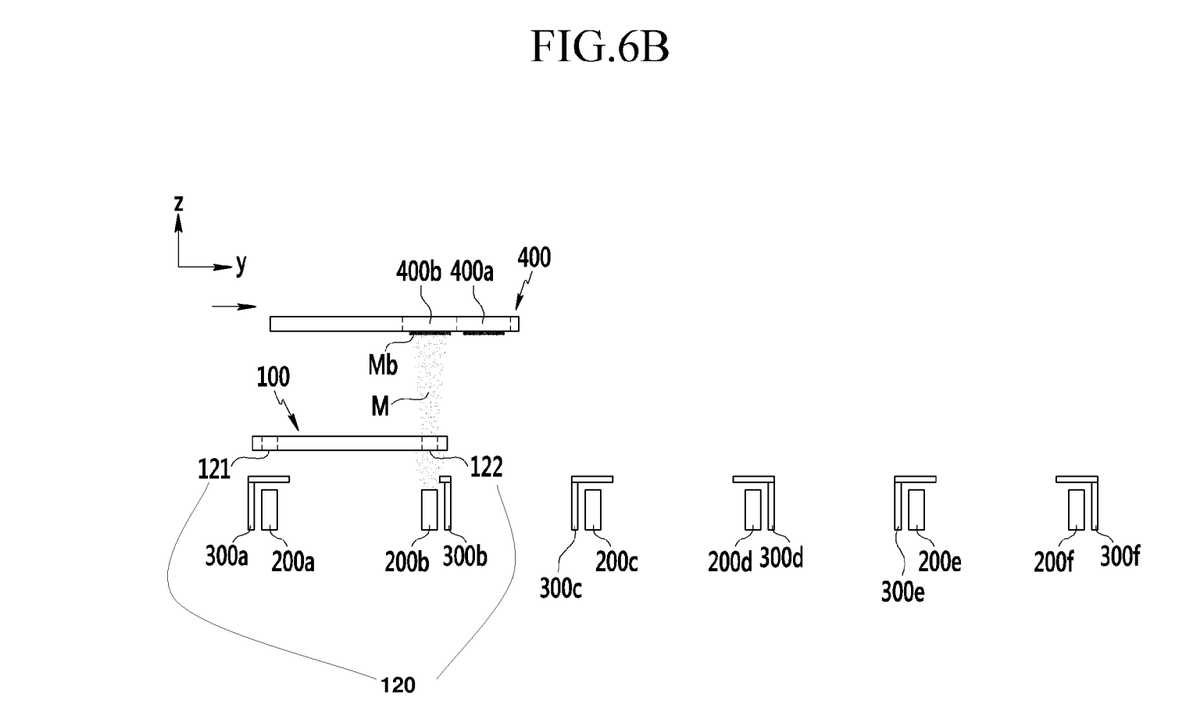
Figure 7A:
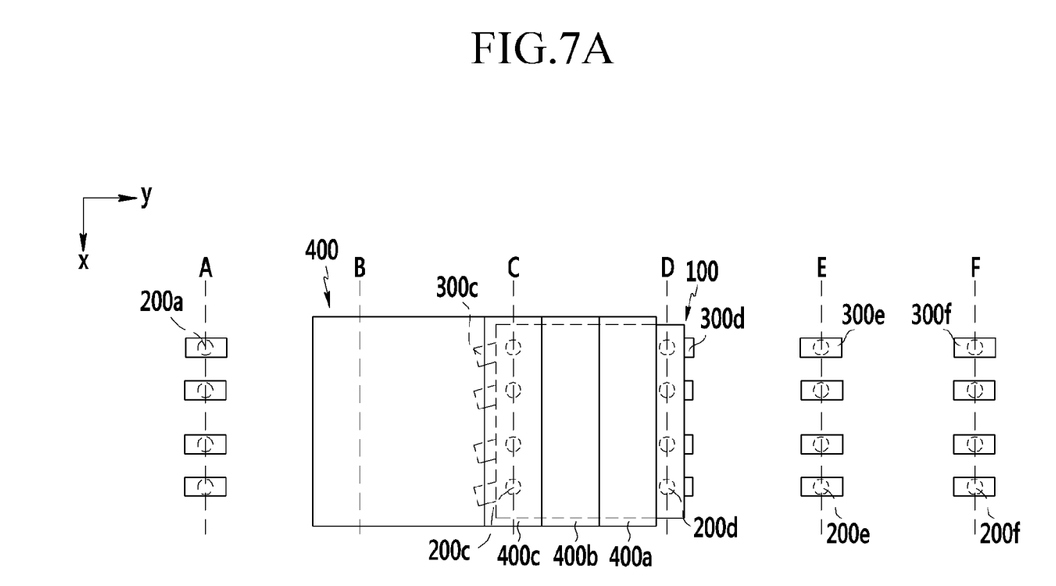
Figure 7B:
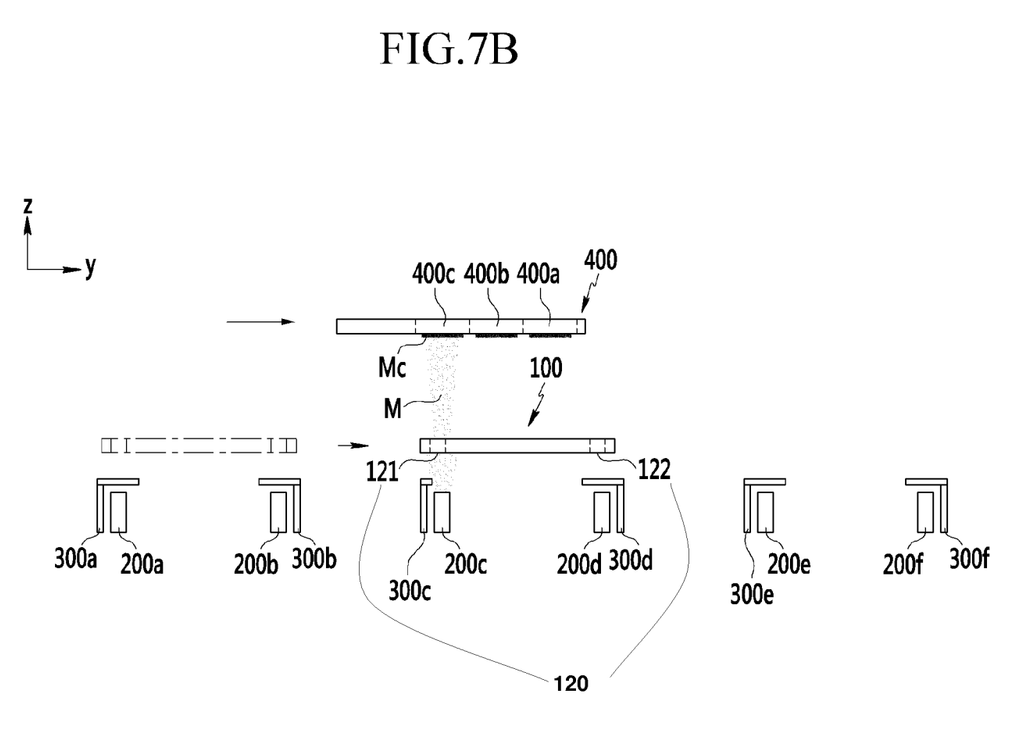

FIG. 4 is a flowchart illustrating a method for measuring a deposition quantity according to another embodiment of the present invention, FIGS. 5A, 6A and 7A are plan views sequentially illustrating the method for measuring a deposition quantity according to another embodiment of the present invention, and FIGS. 5B, 6B and 7B are side views sequentially illustrating the method for measuring a deposition quantity according to another embodiment of the present invention.

Referring to the drawings, a method for measuring a deposition quantity according to another embodiment includes disposing a test substrate (S10), setting a deposition area (S20), opening a depositing source (S30), depositing (S40), closing the depositing source (S50), and measuring the test substrate (S60).

According to an embodiment of the prevent invention, the plurality of depositing sources 200 is disposed in an m×n matrix form having m rows in a first direction (x-axial direction) and n columns in a second direction (y-axial direction) crossing the first direction, and the opening 120 is formed in a matrix form having m rows and k (k<n) columns, but it is not limited thereto. For convenience of the description, in the present exemplary embodiment, as shown in FIG. 1, the depositing sources are disposed in a form having 4 rows and 6 columns, and the openings 120 formed in the main shutter 100 are exemplified in a form having 4 rows and 2 columns so as to correspond to positions of the depositing sources. The 6 columns of the depositing sources are represented by reference numerals A through F, the depositing sources in the respective columns are represented by reference numerals 200a through 200f, and the depositing source shutters in the respective columns are represented by reference numerals 300a through 300f. Two columns of the openings 120 formed in the main shutter 100 are represented by reference numerals 121 and 122, respectively. In addition, the test substrate 400, in which 6 areas 400a through 400 are divided in the second direction so as to be the same as the number of columns of the depositing sources, may be used. In the exemplary embodiment, the deposition is performed from the depositing source 200a disposed in a column A through the depositing source 200f in a column F in sequence, but is not limited thereto and may be performed by being modified in various orders.

First, the test substrate 400 of which the surface is divided into a plurality of areas faces the plurality of depositing sources 200 spraying a deposition material M (S10). The test substrate 400 is fixed to face the depositing source 200 by the substrate holder 500, but for convenience of the description, the substrate holder 500 is not shown. In this case, a passage of the depositing source 200 is closed by each depositing source shutter 300.

One area of the surface of the test substrate 400 is set as a deposition area to which the deposition material M is attached (S20). In this case, the main shutter 100 including the main shutter body 110 with the plurality of openings 120 penetrated in a thickness direction (z direction) is disposed between the depositing source 200 and the test substrate 400 to be set as the deposition area. The respective openings 120 are arranged so as to be overlapped with the deposition area of the test substrate 400 and the passage of the depositing source 200.

In the exemplary embodiment, a depositing source 200a is disposed in a column A and an area 400a of the surface of the test substrate 400 is set as the deposition area to which the deposition material M is attached. In addition, the main shutter 100 is arranged so that the openings 121 and 122 which are formed in two columns are positioned in columns A and B, respectively.

Thereafter, some depositing sources to measure the deposited quantity among the plurality of depositing sources are selectively opened (S30). In the exemplary embodiment, the depositing source 200a disposed in the column A is selected as the depositing source to measure the deposited quantity, and as shown in FIGS. 5A and 5B, each depositing source shutter 300a disposed at one side of each depositing source 200a is opened.

The deposition material M is partially deposited in one area of the surface of the test substrate 400 based on a position corresponding to the depositing source 200 (S40). In the exemplary embodiment, the deposition material M sprayed from the depositing source 200a disposed in the column A is attached to the position corresponding to the depositing source 200 among the area 400a of the surface of the test substrate (see Ma of FIG. 5B).

After a predetermined time has elapsed, the opened depositing source is closed (S50). In the exemplary embodiment, the depositing source 200a is closed by using each depositing source shutter 300a disposed at one side of the depositing source 200a disposed in the column A.

Thereafter, in order to perform deposition for another depositing source in which the deposition is not performed, an area to which the deposition material is not attached yet on the surface of the test substrate may be reset as the deposition area. In the exemplary embodiment, as shown in FIGS. 6A and 6B, the test substrate 400 may move in the second direction so that an area 400b adjacent to the area 400a in which the deposition has been first performed is reset as the deposition area. Since the opening 122 of the main shutter 100 is arranged with a depositing source 200b in a column B, the main shutter 100 does not move.

Thereafter, another depositing source in which the deposition is not performed among the plurality of depositing sources is selected and opened. In the exemplary embodiment, in order to measure the deposition quantity of the depositing source 200b in the column B, each depositing source shutter 300b disposed at one side of each depositing source 200b is opened.

The deposition material M is partially deposited in one area of the surface of the test substrate 400 based on a position corresponding to the depositing source 200. In the exemplary embodiment, the deposition material M sprayed from the depositing source 200b disposed in the column B is attached to a position corresponding to the depositing source 200b among the area 400b of the surface of the test substrate (see Mb of FIG. 6B).

After a predetermined time has elapsed, the opened depositing source is closed. In the exemplary embodiment, the depositing source 200b is closed by using each depositing source shutter 300b disposed at one side of the depositing source 200b disposed in the column B.

Thereafter, in order to perform deposition for another depositing source in which the deposition is not performed, an area in which the deposition is not performed on the surface of the test substrate may be reset as the deposition area to which the deposition material is attached. In the exemplary embodiment, the test substrate 400 may move in the second direction so that an area 400c adjacent to the area 400b in which the deposition has been performed in the previous step is reset as the deposition area. Further, the main shutter 100 also moves in the second direction and thus the openings 121 and 122 which are formed in two columns in the main shutter 100 are arranged to be positioned in a column C and a column D, respectively. In order to measure the deposited quantity of the depositing source 200c in the column C, each depositing source shutter 300c disposed at one side of each depositing source 200c is opened. Thereafter, depositing and closing the depositing source 200c in the column C are the same as those described above, and the deposition material sprayed from the depositing source 200c in the column C is attached to the area 400c of the test substrate (see Mc of FIG. 7B).

In the above method, the deposition may be performed total six times up to the rest of a depositing source 200d in the column D, a depositing source 200e in the column E, and a depositing source 200f in the column F.

As such, when the depositing process for all of the depositing sources 200 is completed, the test substrate 400 is collected and checked. Piles of the deposited material as many as the number corresponding to the depositing sources 200 are formed on one sheet of test substrate 400. For example, like the exemplary embodiment, the plurality of depositing sources 200 is arranged in a matrix form having 4 rows and 6 columns, the piles of the deposition material formed on the test substrate 400 are arranged in the same form. When a deposition thickness of each pile is measured, it may be easily determined whether the deposition quantity of the depositing source disposed at any position is insufficient or excessive. Based on the determined result, it is possible to control the deposition quantity of an abnormal depositing source.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A deposition apparatus, comprising:
   a plurality of depositing sources of which each configured to spray a deposition material;
   a movable substrate holder configured to fix a substrate to face the depositing sources;
   a plurality of depositing source shutters, each being disposed at one side of corresponding ones of the depositing sources and configured to open and close a passage of the deposition material; and
   a movable main shutter disposed between the depositing source shutters and the substrate fixed to the movable substrate holder and having a plurality of openings of which each, during deposition, has one to one correspondence with corresponding ones of the depositing sources, configured to deposit a part of the deposition material on the substrate through the movable main shutter.

2. The deposition apparatus of claim 1, wherein the movable main shutter includes a main shutter body with the plurality of openings penetrating the main shutter body in a thickness direction.

3. The deposition apparatus of claim 2, wherein the plurality of openings are formed in correspondence with positions of passages from the plurality of depositing sources.

4. The deposition apparatus of claim 3, further comprising a plurality of guiding units, each surrounding respective ones of the openings and disposed on one surface of the main shutter body facing the depositing sources.

5. The deposition apparatus of claim 3, wherein:
the plurality of depositing sources are disposed in a matrix form having m rows in a first direction and n columns in a second direction crossing the first direction, and
the openings are formed in a matrix form having m rows and k columns, where (k<n).

6. The deposition apparatus of claim 5, wherein the movable main shutter is movable in the second direction.

7. The deposition apparatus of claim 5, wherein the movable substrate holder is movable in the second direction.

8. A deposition apparatus, comprising:
a plurality of depositing sources, each being configured to spray a deposition material;
a substrate facing the depositing sources, the substrate being mounted in a substrate holder movable with respect to the depositing sources;
a plurality of depositing source shutters disposed between the substrate and the depositing sources, each depositing source shutter being configured to open and close the depositing sources with respect to movement of the substrate holder; and
a main shutter disposed between the depositing source shutters and the substrate, the main shutter being movable with respect to the depositing sources, the main shutter having a plurality of openings of which each, during deposition, has one to one correspondence with corresponding ones of the depositing sources to enable deposition of a portion of the deposition material on the substrate.

9. The deposition apparatus of claim 8, wherein the main shutter includes a main shutter body with the plurality of openings penetrating the main shutter body in a thickness direction.

10. The deposition apparatus of claim 9, wherein the plurality of openings are formed in correspondence with positions of passages from the plurality of depositing sources.

11. The deposition apparatus of claim 10, further comprising a plurality of guiding units disposed on one surface of the main shutter body facing the depositing source shutters, each guiding unit surrounding respective ones of the openings.

12. The deposition apparatus of claim 11, wherein:
the plurality of depositing sources are disposed in a matrix form having m rows in a first direction and n columns in a second direction crossing the first direction, and
the openings are formed in a matrix form having m rows and k columns, where (k<n).

13. A deposition apparatus, comprising:
a first plurality of depositing sources, each being configured to spray a deposition material;
a substrate facing the depositing sources, the substrate being mounted in a substrate holder;
a first plurality of depositing source shutters disposed between the substrate and the depositing sources, each depositing source shutter being configured to open and close respective ones of the depositing sources; and
a main shutter disposed between the depositing source shutters and the substrate, the main shutter having a second plurality of openings less than the first plurality of depositing sources of which each, during deposition, has one to one correspondence with corresponding ones of the depositing sources to enable deposition of a portion of the deposition material on the substrate.

14. The deposition apparatus of claim 13, wherein the main shutter includes a main shutter body with the plurality of openings penetrating the main shutter body in a thickness direction.

15. The deposition apparatus of claim 14, further comprising a second plurality of guiding units disposed on one surface of the main shutter body facing the depositing source shutters, each guiding unit surrounding respective ones of the openings.

16. The deposition apparatus of claim 13, wherein:
the plurality of depositing sources are disposed in a matrix form having m rows in a first direction and n columns in a second direction crossing the first direction, and
the openings are formed in a matrix form having m rows and k columns, where (k<n).

17. The deposition apparatus of claim 13, wherein the substrate and the main shutter are movable across a path of the deposition material during deposition.

* * * * *